United States Patent [19]
Grumbine et al.

[11] Patent Number: 6,083,419
[45] Date of Patent: Jul. 4, 2000

[54] POLISHING COMPOSITION INCLUDING AN INHIBITOR OF TUNGSTEN ETCHING

[75] Inventors: Steven K. Grumbine; Christopher C. Streinz, both of Aurora; Eric W. G. Hoglund, Algonquin, all of Ill.

[73] Assignee: Cabot Corporation, Boston, Mass.

[21] Appl. No.: 08/901,803

[22] Filed: Jul. 28, 1997

[51] Int. Cl.$^7$ .............................. C23F 1/44; C23F 11/00
[52] U.S. Cl. ........................ 252/79.1; 438/692; 216/88
[58] Field of Search ................... 438/692; 252/79.1, 252/79.2, 79.3, 79.4, 79.5; 216/88, 89

[56] References Cited

U.S. PATENT DOCUMENTS

| | | |
|---|---|---|
| 3,385,682 | 5/1968 | Lowen . |
| 3,565,707 | 2/1971 | Radimer et al. . |
| 3,668,131 | 6/1972 | Banush et al. . |
| 3,843,430 | 10/1974 | Kinder . |
| 4,086,176 | 4/1978 | Ericson et al. . |
| 4,169,337 | 10/1979 | Payne . |
| 4,251,384 | 2/1981 | Rooney . |
| 4,345,969 | 8/1982 | James et al. . |
| 4,462,188 | 7/1984 | Payne . |
| 4,588,421 | 5/1986 | Payne . |
| 4,992,135 | 2/1991 | Doan . |
| 5,173,438 | 12/1992 | Sandhu . |
| 5,209,816 | 5/1993 | Yu et al. . |
| 5,230,833 | 7/1993 | Romberger et al. . |
| 5,340,370 | 8/1994 | Cadien et al. . |
| 5,391,258 | 2/1995 | Brancaleoni et al. . |
| 5,407,527 | 4/1995 | Danielson et al. . |
| 5,476,606 | 12/1995 | Brancaleoni et al. . |
| 5,571,373 | 11/1996 | Krishna et al. . |
| 5,575,837 | 11/1996 | Kodama et al. . |
| 5,614,444 | 3/1997 | Farkas et al. . |
| 5,645,736 | 7/1997 | Allman . |
| 5,735,963 | 4/1998 | Obeng . |
| 5,770,095 | 6/1998 | Sasaki et al. . |
| 5,783,489 | 7/1998 | Kaufman et al. . |
| 5,958,288 | 9/1999 | Mueller et al. . |

FOREIGN PATENT DOCUMENTS

| | | |
|---|---|---|
| 0 357 205 | 3/1990 | European Pat. Off. . |
| 8-83780 | 3/1996 | Japan . |
| WO 96/38262 | 12/1996 | WIPO . |
| WO 98/23408 | 6/1998 | WIPO . |
| WO 98/26025 | 6/1998 | WIPO . |

*Primary Examiner*—R. Bruce Breneman
*Assistant Examiner*—Alva C. Powell

[57] ABSTRACT

A chemical mechanical polishing composition comprising a composition capable of etching tungsten and one inhibitor of tungsten etching and methods for using the composition to polish tungsten containing substrates.

47 Claims, No Drawings

POLISHING COMPOSITION INCLUDING AN INHIBITOR OF TUNGSTEN ETCHING

BACKGROUND OF THE INVENTION

1. Field of the Invention

This invention concerns a chemical mechanical polishing (CMP) composition including a compound capable of etching tungsten and at least one inhibitor of tungsten etching. The polishing composition is useful alone or in combination with other chemicals and abrasives for polishing metal layers and thin-films associated with semiconductor manufacturing where one of the layers or films is comprised of tungsten.

2. Description of the Related Art

Integrated circuits are made up of millions of active devices formed in or on a silicon substrate. The active devices, which are initially isolated from one another, are united to form functional circuits and components. The devices are interconnected through the use of well-known multilevel interconnections. Interconnection structures normally have a first layer of metallization, an interconnection layer, a second level of metallization, and sometimes a third and subsequent levels of metallization. Interlevel dielectrics such as doped and undoped silicon dioxide ($SiO_2$), are used to electrically isolate the different levels of metallization in a silicon substrate or well. The electrical connections between different interconnection levels are made through the use of metallized vias and in particular tungsten vias. U.S. Pat. No. 4,789,648, which is incorporated herein by reference, describes a method for preparing multiple metallized layers and metallized vias in insulator films. In a similar manner, metal contacts are used to form electrical connections between interconnection levels and devices formed in a well. The metal vias and contacts are generally filled with tungsten and generally employ an adhesion layer such as titanium nitride (TiN) and/or titanium to adhere a metal layer such as a tungsten metal layer to $SiO_2$.

In one semiconductor manufacturing process, metallized vias or contacts are formed by a blanket tungsten deposition followed by a chemical mechanical polish (CMP) step. In a typical process, via holes are etched through an interlevel dielectric (ILD) to interconnection lines or to a semiconductor substrate. Next, a thin adhesion layer such as titanium nitride and/or titanium is generally formed over the ILD and is directed into the etched via hole. Then, a tungsten film is blanket deposited over the adhesion layer and into the via. The deposition is continued until the via hole is filled with tungsten. Finally, the excess tungsten is removed by chemical mechanical polishing (CMP) to form metal vias. Processes for manufacturing and/or CMP of ILD's are disclosed in U.S. Pat. Nos. 4,671,851, 4,910,155 and 4,944,836.

In a typical chemical mechanical polishing process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as a "slurry" is deposited onto the pad during polishing. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed.

The slurry composition is an important factor in the CMP step. Depending on the choice of the oxidizing agent, the abrasive, and other useful additives, the polishing slurry can be tailored to provide effective polishing of metal layers at desired polishing rates while minimizing surface imperfections, defects, corrosion, and erosion of oxide in areas with tungsten vias. Furthermore, the polishing slurry may be used to provide controlled polishing selectivities to other thin-film materials used in current integrated circuit technology such as titanium, titanium nitride and the like.

Typically CMP polishing slurries contain an abrasive material, such as silica or alumina, suspended in an oxidizing, aqueous medium. For example, U.S. Pat. No. 5,244,523 to Yu et al. reports a slurry containing alumina, hydrogen peroxide, and either potassium or ammonium hydroxide that is useful in removing tungsten at predictable rates with little removal of the underlying insulating layer. U.S. Pat. No. 5,209,816 to Yu et al. discloses a slurry comprising perchloric acid, hydrogen peroxide and a solid abrasive material in an aqueous medium. U.S. Pat. No. 5,340,370 to Cadien and Feller discloses a tungsten polishing slurry comprising approximately 0.1M potassium ferricyanide, approximately 5 weight percent silica and potassium acetate. Acetic acid is added to buffer the pH at approximately 3.5.

Most of the currently available CMP slurries contain large concentrations of dissolved, ionic metallic components. As a result, the polished substrates can become contaminated by the adsorption of charged species into the interlayers. These species can migrate and change the electrical properties of the devices at gates and contacts and change the dielectric properties of the $SiO_2$ layers. These changes may reduce the reliability of the integrated circuits with time. Therefore, it is desirable to expose the wafer only to high purity chemicals with very low concentrations of mobile metallic ions.

CMP compositions are increasingly being formulated with chemical ingredients that are capable of etching tungsten in an effort to improve the rate at which tungsten vias are polished. However, in many cases the resulting CMP slurry compositions etch tungsten in a manner that solubilizes the tungsten instead of converting the surface to a soft oxidized film with improved tungsten abradeability. Due to these chemical compositions, recessing of the tungsten plug due to undesireable tungsten etching occurs. Recessed tungsten vias, where the surface of the tungsten is below that of the surrounding insulator surface, are a problem because they can cause electrical contact problems to other parts of the device. In addition, problems due to tungsten recess may be caused by the fact that the resulting nonplanarity may complicate the deposition of metal layers on subsequent levels of the device.

Tungsten etching can also cause undesireable "keyholing" of tungsten vias. Keyholing is a phenomenon whereby a hole is etched into the center of a tungsten via and, thereafter, the hole migrates towards the sides of the via. Keyholing causes the same contact and filling problems as recessing.

A new CMP composition is needed that both polishes tungsten at high rates and that does not cause undesirable tungsten plug recessing.

SUMMARY OF THE INVENTION

The present invention is directed to a chemical mechanical polishing composition that is capable of polishing tungsten at high rates with minimal etching and/or corrosion.

In addition, the chemical mechanical polishing composition of this invention is able to polish substances with tungsten layers at controlled rates with good trans-surface uniformity.

This invention is also a state-of-the-art chemical mechanical polishing composition that is able to polish a substrate including tungsten vias at very high rates to give a polished substrate that is capable of accepting a subsequent layer of metallization without filling, or contact problems caused by unacceptable recessing or keyholing.

Furthermore, this invention is directed to methods for using the chemical mechanical polishing composition of this invention in a slurry to polish a plurality of metal layers in an integrated circuit including tungsten layers.

In one embodiment, this invention is a chemical mechanical polishing composition comprising a compound that is capable of etching tungsten, and at least one inhibitor of tungsten etching.

In another embodiment, this invention is a chemical mechanical polishing slurry comprising from about 1.0 to about 15.0 weight percent silica, from about 0.001 to about 0.2 weight percent ferric nitrate catalyst, from about 1.0 to about 10.0 weight percent hydrogen peroxide, at least one stabilizer, and from about 0.001 to about 2.0 wt % of at least one inhibitor of tungsten etching.

In yet another embodiment, this invention is a method for polishing a substrate including at least one tungsten layer. The method begins by admixing at least one compound that is capable of etching tungsten, at least one inhibitor of tungsten etching and deionized water to give a chemical mechanical polishing composition. The chemical mechanical polishing composition is applied to the substrate, and at least a portion of the tungsten layer is removed from the substrate by bringing a pad into contact with the substrate and moving the pad in relation to the substrate.

DESCRIPTION OF THE CURRENT EMBODIMENT

The present invention relates to a chemical mechanical polishing composition that comprises a compound that is capable of etching tungsten and at least one inhibitor of tungsten etching. The chemical mechanical polishing composition is used to polish at least one tungsten metal layer associated with a substrate selected from the group including silicon substrates, TFT-LCD glass substrates, GaAs substrates, and other substrates associated with integrated circuits, thin films, multiple level semiconductors, and wafers. In particular, the chemical mechanical polishing composition of this invention exhibits excellent polishing performance when used to polish a substrate including one or more layers of tungsten, titanium, and titanium nitride layers of a substrate in a single step.

Before describing the details of the various preferred embodiments of this invention, some of the terms that are used herein will be defined. The "chemical mechanical composition" refers to the combination comprising a compound that is capable of etching tungsten and at least one inhibitor of tungsten etching that may be used in conjunction with an abrasive pad to remove one or more layers of metal from a multiple layer metallization.

The term "chemical mechanical polishing slurry" or "CMP slurry", refers to another useful product of this invention that comprises the chemical mechanical composition of this invention and at least one abrasive. The CMP slurry is useful for polishing a multiple level metallization which may include but is not limited to semi-conductor thin-films, integrated circuit thin-films, and for polishing any other films, surfaces and substrates where CMP processes are useful.

One aspect of this invention is a chemical mechanical composition comprising a compound that is capable of etching tungsten and at least one inhibitor of tungsten etching. The chemical mechanical composition of this invention is useful when incorporated in a chemical mechanical polishing slurry to polish a metal layer including tungsten. The combinations disclosed herein are useful when incorporated into a CMP slurry or when used alone in conjunction with an abrasive pad to polish metals and metal based components including tungsten, titanium, titanium nitride, copper, aluminum and various mixtures and combinations thereof.

The chemical mechanical composition of this invention includes at least one compound that is capable of etching tungsten. The term "compound capable of etching tungsten" as used herein refers to a compound that corrodes tungsten by turning solid tungsten metal or its oxide into a soluble tungsten corrosion product. A compound that is capable of etching tungsten may include one or more components that react with tungsten metal or its oxide to form soluble tungsten corrosion products and/or it may refer to a composition that is applied to tungsten at controlled conditions, such as high pH, high temperature, high pressure or combinations thereof, that promote the conversion of tungsten metal or its oxide into soluble tungsten corrosion products.

Non-limiting examples of compounds that are capable of etching tungsten include oxidizing agents, and fluoride containing compounds. Many oxidizing agents etch tungsten at low rates at low pH. Sometimes, composition pH can enhance the tungsten etching rate of oxidizing agents.

The compound capable of etching tungsten of this invention may be a fluoride containing additive. Fluoride containing additives useful as tungsten etchants may be any known fluoride containing additives in an aqueous solution. Examples of useful fluoride containing additives include fluoride salts, fluoride containing acids, fluoride polymers, and any other organic or inorganic fluoride containing additives that react with titanium.

Aqueous compounds that are applied to tungsten at temperatures, pressures, and/or pH's that promote tungsten etching also fall within the definition of compounds that are capable of etching tungsten. When composition application conditions are controlled to cause tungsten etching, then it is preferred that solution pH is the controlled composition application parameter. Tungsten etching occurs at an aqueous solution at a pH above about 4.0.

The compound capable of etching tungsten may be one or more oxidizing agents. Examples of useful oxidizing agents include, but are not limited to, hydrogen peroxide and its adducts such as urea hydrogen peroxide and percarbonates, organic peroxides such as benzoyl peroxide, peracetic acid, and di-t-butyl peroxide, monopersulfates ($SO_5^-$), dipersulfates ($S_2O_8^-$), sodium peroxide, and mixtures thereof.

A preferred compound capable of etching tungsten is hydrogen peroxide.

Oxidizing agents may be present in the overall chemical mechanical polishing composition in an amount ranging from about 0.5 to about 50.0 weight percent. It is preferred that one or more oxidizing agents is present in the polishing composition in an amount ranging from about 0.5 to about 10.0 weight percent.

Compositions of this invention include at least one inhibitor of tungsten etching. The compound inhibits the conversion of solid tungsten into soluble tungsten compounds while at the same time allowing the composition to convert tungsten to a soften oxidized film that it can be evenly removed by abrasion. Classes of compositions that we have discovered are useful inhibitors of tungsten etching include compounds having functional groups including nitrogen containing heteroycles, thiols and sulfides, alkyl ammonium ions and single compounds including a mixture of these functional groups.

Examples of corrosion inhibitors hydrogen containing heterocycle function groups include 2,3,5-trimethylpyrazine, 2-ethyl-3,5-dimethylpyrazine, quinoxaline, acetyl pyrrole, pyridazine, histidine, pyrazine, benzimidazole and mixtures thereof.

Examples of corrosion inhibitors including thiol and sulfide functional groups include glutathione (reduced), cysteine, 2-mercapato benzimidazole, cystine, thiophene, mercapato pyridine N-oxide, thiamine hydrochloride, tetraethyl thiuram disulfide, 2,5-dimercapto-1,3-thiadiazole and mixtures thereof The term "alkyl ammonium ion" as used herein refers to compounds having functional groups that produce alkyl ammonium ions in aqueous solutions upon dissolution. Examples of corrosion inhibitors including alkyl ammonium ion functional groups include monoquat isies (isostearylethylimididonium), cetyltrimethyl ammonium hydroxide, alkaterge E (2-heptadecenyl-4-ethyl-2 oxazoline 4-methanol), aliquat 336 (tricaprylmethyl ammonium chloride), nuospet 101 (4,4 dimethyloxazolidine), tetrabutylammonium hydroxide, dodecylamine, tetramethylammonium hydroxide and mixtures thereof.

The inhibitor of tungsten etching should be present in the composition of this invention an amount ranging from about 0.001 to about 2.0 weight percent and preferably from about 0.005 to about 1.0 weight percent.

The chemical mechanical composition of this invention optionally includes at least one catalyst. The purpose of the catalyst is to transfer electrons from the metal being oxidized to the oxidizer (or analogously to transfer electrochemical current from the oxidizer to the metal). The catalyst or catalysts chosen may be metallic, non-metallic, or a combination thereof and the catalyst must be able to shuffle electrons efficiently and rapidly between the oxidizer and metal substrate surface. Preferably, the catalyst is an iron catalyst such as, but not limited to, inorganic salts of iron, such as iron (II or III) nitrate, iron (II or III) sulfate, iron (II or III) halides, including fluorides, chlorides, bromides, and iodides, as well as perchlorates, perbromates and periodates, and ferric organic iron (II or III) compounds such as but not limited to acetates, acetylacetonates, citrates, gluconates, oxalates, phthalates, and succinates, and mixtures thereof.

The catalyst may be present in the chemical mechanical polishing composition in an amount ranging from about 0.001 to about 2.0 weight percent. It is preferred that the catalyst will be present in the chemical mechanical polishing composition in an amount ranging from about 0.005 to about 0.5 weight percent. It is most preferred that the catalyst will be present in the composition in an amount ranging from about 0.01 to about 0.05 weight percent.

The amount of catalyst in the chemical mechanical composition of this invention may be varied depending upon the oxidizing agent used. When the preferred oxidizing agent hydrogen peroxide is used in combination with a preferred catalyst such as ferric nitrate, the catalyst will preferably be present in the composition in an amount ranging from about 0.005 to about 0.20 weight percent (approximately 7 to 280 ppm Fe in solution).

The concentration ranges of catalyst in the chemical mechanical polishing slurry of this invention are generally reported as a weight percent of the entire compound. The use of high molecular weight metal containing compounds that comprise only a small percentage by weight of catalyst is well within the scope of catalysts in this invention. The term catalyst when used herein also encompasses compounds wherein the catalytic metal comprises less than 10% by weight of the metal in the composition and wherein the metal catalyst concentration in the CMP slurry is from about 2 to about 3000 ppm of the overall slurry weight.

A preferred chemical mechanical composition of this invention includes hydrogen peroxide and an iron catalyst. The preferred inhibitor of tungsten etching for this composition is pyridazine. Pyridazine does not adversely effect the iron catalyst, it is stable to decomposition from peroxides and it does not significantly reduce tungsten polishing rates.

The chemical mechanical composition of this invention may be combined with at least one abrasive to produce a CMP slurry. The abrasive is typically a metal oxide abrasive. The metal oxide abrasive may be selected from the group including alumina, titania, zirconia, germania, silica, ceria and mixtures thereof. The CMP slurry of this invention preferably includes from about 1.0 to about 20.0 weight percent or more of an abrasive. It is more preferred, however, that the CMP slurry of this invention includes from about 3.0 to about 7.0 weight percent abrasive.

The metal oxide abrasive may be produced by any techniques known to those skilled in the art. Metal oxide abrasives can be produced using process such as sol-gel, hydrothermal or, plasma process, or by processes for manufacturing fumed or precipitated metal oxides. Preferably, the metal oxide is a fumed or precipitated abrasive and, more preferably it is a fumed abrasive such as fumed silica or fumed alumina. For example, the production of fumed metal oxides is a well-known process which involves the hydrolysis of suitable feedstock vapor (such as aluminum chloride for an alumina abrasive) in a flame of hydrogen and oxygen. Molten particles of roughly spherical shapes are formed in the combustion process, the diameters of which are varied through process parameters. These molten spheres of alumina or similar oxide, typically referred to as primary particles, fuse with one another by undergoing collisions at their contact points to form branched, three dimensional chain-like aggregates. The force necessary to break aggregates is considerable and often considered irreversible. During cooling and collecting, the aggregates undergo further collision that may result in some mechanical entanglement to form agglomerates. Agglomerates are thought to be loosely held together by van der Waals forces and can be reversed, i.e., de-agglomerated, by proper dispersion in a suitable media.

Precipitated abrasives may be manufactured by conventional techniques such as by coagulation of the desired particles from an aqueous medium under the influence of high salt concentrations, acids or other coagulants. The particles are filtered, washed, dried and separated from residues of other reaction products by conventional techniques known to those skilled in the art.

A preferred metal oxide will have a surface area, as calculated from the method of S. Brunauer, P. H. Emmet, and I. Teller, J. American Chemical Society, Volume 60, Page 309 (1938) and commonly referred to as BET, ranging from about 5 $m^2/g$ to about 430 $m^2/g$ and preferably from about 30 $m^2/g$ to about 170 $m^2/g$. Due to stringent purity requirements in the IC industry the preferred metal oxide should be of a high purity. High purity means that the total impurity content, from sources such as raw material impurities and trace processing contaminants, is typically less than 1% and preferably less than 0.01% (i.e., 100 ppm).

In this preferred embodiment, the metal oxide abrasive consists of metal oxide aggregates having a size distribution less than about 1.0 micron, a mean aggregate diameter less than about 0.4 micron and a force sufficient to repel and overcome the van der Waals forces between abrasive aggregates themselves. Such metal oxide abrasive has been found to be effective in minimizing or avoiding scratching, pit marks, divots and other surface imperfections during polishing. The aggregate size distribution in the present invention may be determined utilizing known techniques such as transmission electron microscopy (TEM). The mean aggregate diameter refers to the average equivalent spherical diameter when using TEM image analysis, i.e., based on the cross-sectional area of the aggregate. By force is meant that either the surface potential or the hydration force of the metal oxide particles must be sufficient to repel and overcome the van der Waals attractive forces between the particles.

In another preferred embodiment, the metal oxide abrasive may consist of discrete, individual metal oxide particles having a primary particle diameter less than 0.4 micron (400 nm) and a surface area ranging from about 10 $m^2/g$ to about 250 $m^2/g$.

It is preferred that the metal oxide abrasive is silica having a surface area of from about 120 $m^2/g$ to about 200 $m^2/g$.

Preferably, the metal oxide abrasive is incorporated into the aqueous medium of the polishing slurry as a concentrated aqueous dispersion of metal oxides, which concentrated aqueous dispersion of metal oxide abrasives typically ranges from about 3% to about 45% solids, and preferably between 10% and 20% solids. The aqueous dispersion of metal oxides may be produced utilizing conventional techniques, such as slowly adding the metal oxide abrasive to an appropriate medium, for example, deionized water, to form a colloidal dispersion. The dispersion is typically completed by subjecting it to high shear mixing conditions known to those skilled in the art. The pH of the slurry may be adjusted away from the isoelectric point to maximize colloidal stability.

Other well known polishing slurry additives may be incorporated alone or in combination into the chemical mechanical polishing slurry of this invention. A non-inclusive list is inorganic acids, organic acids, surfactants, alkyl ammonium salts or hydroxides, and dispersing agents.

An optional additive which may be useful with this invention is one which stabilizes the inorganic or organic per compound in the presence of a metal complex. For example, it is well known that hydrogen peroxide is not stable in the presence of many metal ions without the use of stabilizers. For this reason, the CMP composition and slurries of this invention may include a stabilizer. Without the stabilizer, the optional catalyst and the inorganic or organic per compound may react in a manner that degrades the per compound rapidly over time. The addition of a stabilizer to compositions of this invention reduces the effectiveness of the catalyst. Therefore the choice of the type and amount of stabilizer added to the composition is important and has a significant impact on CMP performance.

The addition of a stabilizer to the compositions and slurries of this invention is presently understood to create a stabilizer/catalyst complex that inhibits the catalyst from reacting with the oxidizing agent. For purpose of this disclosure the term "product of the mixture of at least one catalyst having multiple oxidation states and at least one stabilizer" refers to an admixture of both ingredients as used in a composition and slurry whether or not the combination of ingredients forms a complex in the end product.

A preferred stabilizer is from about 2 equivalents per catalyst to about 15 equivalents per catalyst of malonic acid.

The chemical mechanical polishing composition of this invention has been found to have a high tungsten (W) polishing rate as well as good polishing rates towards titanium (Ti). In addition, the chemical mechanical polishing composition exhibits desirable low polishing rates towards the dielectric insulating layer.

The composition of this invention may be produced using any techniques known to those skilled in the art. For example, the compound capable of etching tungsten and the compound which acts to inhibit tungsten etching may be combined before applying the composition to a tungsten containing wafer or they may be independently applied to a polishing pad or to a tungsten wafer before or during tungsten wafer polishing. The composition of this invention may generally be manufactured by combining the ingredients together in any order.

In one method, for example, the compound capable of etching tungsten and tungsten etching inhibitor are mixed into an aqueous medium, such as deionized or distilled water, at pre-determined concentrations under low shear conditions until such components are completely dissolved in the medium. A concentrated dispersion of the metal oxide abrasive, such as fumed silica, is optionally added to the medium and diluted to the desired loading level of abrasive in the final CMP slurry. In addition, optional catalyst and other additives such as one or more stabilizers, may be added to the slurry by any method that is able to incorporate metal catalytic compounds of this invention in an aqueous solution.

In another method, the stabilizer and catalyst are admixed to form a complex prior to combining the complex with an oxidizing agent such as hydrogen peroxide. This may be accomplished by admixing the stabilizer and a metal oxide abrasive dispersion to give an abrasive/stabilizer dispersion followed by admixing the catalyst with the abrasive/stabilizer dispersion to give a catalyst/stabilizer complex in a metal oxide dispersion. The oxidizing agent is then added to the admixture. When the metal oxide abrasive is alumina, then the stabilizer and catalyst should be admixed to form a complex prior to admixing the complex with the alumina abrasive, otherwise the catalyst may be rendered ineffective.

Some inhibitors of tungsten etching may decompose in the presence of hydrogen peroxide or other compositions capable of etching tungsten. If there are compatibility problems between the inhibitor of tungsten etching and other compound ingredients, then the inhibitor should be combined with the other ingredients immediately before use.

The compositions of the present invention may be supplied as a one package system comprising at least a composition capable of etching tungsten and an inhibitor of tungsten etching. Optional components, such as an abrasive and any optional additives may be placed in either the first container, the second container or in a third container. Furthermore, the components in the first container or second container may be in dry form while the components in the corresponding container are in the form of an aqueous dispersion. For example, the first container may comprise an organic per compound such as hydrogen peroxide, in liquid form while the second container comprises an inhibitor of tungsten etching in dry form. Alternately, the first container may comprise a dry per compound or fluoride containing compound while the second container may comprise an aqueous solution of at least one inhibitor of tungsten etching. Other two-container, and three or more container combinations of the ingredients of the chemical mechanical composition and CMP slurry of this invention are within the knowledge of one of ordinary skill in the art.

EXAMPLES

We have discovered that a composition including a compound capable of etching tungsten and an inhibitor of tungsten etching is capable of polishing a multiple metal layer comprising tungsten and titanium at high controlled rates while exhibiting an acceptable low polishing rate towards the dielectric layer.

The following examples illustrate preferred embodiments of this invention as well as preferred methods for using compositions of this invention.

Example 1

A chemical mechanical polishing slurry was prepared in order to evaluate the ability of the resulting slurries to etch tungsten. A standard CMP slurry was prepared consisting of an aqueous solution of 5.3 wt % silica, 53 ppm iron in the form of ferric nitrate, 3.75 wt % $H_2O_2$, and 0.05 wt % malonic acid. Small uniform pieces of a tungsten wafer were immersed in the CMP slurry for 30 minutes, recovered, dried, and the thickness measured by resistivity. The rate of tungsten etching was then calculated in units of Å/min. The standard slurry exhibited a tungsten etching rate of 41 Å/min.

0.04 wt % of compounds viewed as potential inhibitors of tungsten etching were added to the standard slurry after which the ability of the CMP slurry to etch tungsten was evaluated. The results of the etching tests are reported in Table 1, below.

TABLE 1

Tungsten Etching Evaluation

| Slurry | Additive | Rate Ang/min |
|---|---|---|
| 1 | none | 41 |
| 2 | 2,3,5-Trimethylpyrazine | 35 |
| 3 | 2-Ethyl-3,5,Dimethylpyazine | 33 |
| 4 | Quinoxaline | 31 |
| 5 | 2-Acetyl pyrrole | 36 |
| 6 | Pryridazine | 31 |
| 7 | Histidine | 6 |
| 8 | Pyrazole | 48 |
| 9 | 5-Nitroindazole | 37 |
| 10 | 3,5-Dimethylpyrazole | 38 |
| 11 | Pyrazine | 31 |
| 12 | Benzimidazole | 36 |
| 13 | Benzotriazole | 40 |
| 14 | Pyridine | 45 |
| 15 | Monoquat Isies (isostearylethylimididonium) | 1 |
| 16 | Cetyltrimethyl Ammonium Hydroxide | 3 |
| 17 | Alkaterge E (2-heptadecenyl-4-ethyl-2 oxazoline 4-methanol) | 9 |
| 18 | Aliquat 336 (tricaprylmethyl ammonium chloride) | 22 |
| 19 | Nuosept 101 (4,4 dimethyloxazolidine) | 37 |
| 20 | Tetrabutylammonium hydroxide | 40 |
| 21 | Tetramethylammonium hydroxide | 40 |
| 22 | Glutathione (reduced) | 3 |
| 23 | Cysteine | 6 |
| 24 | 2-mercapto benzimidazole | 35 |
| 25 | Cystine | 5 |
| 26 | thiophene | 40 |
| 27 | Mercapto Pyridine N-Oxide | 39 |
| 28 | thiamine hydrochloride | 11 |
| 29 | Tetraethyl Thiuram Disulfide | 39 |
| 30 | 2,5-Dimercapto-1,3-Thiadiazole | 47 |

Example 2

A polishing slurry was prepared in order to evaluate its performance on tungsten wafer CMP. Performance parameters measured included tungsten polishing rates. A standard abrasive slurry including 5.0 weight percent colloidal silica, 0.036 wt % ferric nitrate nonahydrate, 6.0 weight percent of hydrogen peroxide, 0.05 weight percent malonic acid and deionized water with an without 0.05 wt % of pyridazine, a tungsten corrosion inhibitor.

The CMP slurry was applied to chemically-mechanically polish a tungsten patterned wafer having thickness of approximately 8000 Å of tungsten using a SUBA500/SUBAIV pad stack manufactured by Rodel, Inc. The polishing was performed using a IPEC 472 tool at a down force of 5 psi, a slurry flow rate of 150 ml/min, a table speed of 60 rpm, and a spindle speed of 65 rpm.

Without the pyridazine tungsten corrosion inhibitor, the CMP slurry exhibited tungsten plug recessing of about 350 Å on a 0.5 micrometer plug. The addition of 0.05 wt % pyridazine tungsten corrosion inhibitor decreased tungsten plug recessing to about 230 Å without any loss in other polishing performance characteristics such as rate, uniformity and erosion.

What we claim is:

1. A chemical mechanical polishing composition comprising:
    a compound that is capable of etching tungsten; and at least one inhibitor of tungsten etching wherein the inhibitor of tungsten etching is a compound including at least one functional group selected from nitrogen containing heterocycles without nitrogen-hydrogen bonds, sulfides, oxazolidines or mixtures of functional groups in one compound.

2. The chemical mechanical composition of claim 1 wherein the inhibitor of tungsten is a compound including a nitrogen containing heterocycle without nitrogen-hydrogen bonds selected from the group consisting of 4-ethyl-2-oxazoline 4-methanol, 2,3,5-trimethylpyrazine, 2-ethyl-3.5-dimethylpyrazine, quinoxaline, pyridazine, pyrazine, and mixtures thereof.

3. The chemical mechanical polishing composition of claim 1 wherein the inhibitor of tungsten etching is selected from glutathione (reduced), thiophene, mercapto pyridine n-oxide, thiamine hydrochloride, tetraethyl thiuram disulfide, and mixtures thereof.

4. An aqueous solution of the chemical mechanical polishing composition of claim 1.

5. The chemical mechanical composition of claim 1 wherein the component capable of etching tungsten has a pH capable of etching tungsten.

6. The chemical mechanical polishing composition of claim 5 wherein the pH of the compound capable of etching tungsten is greater than about 4.0.

7. The chemical mechanical polishing composition of claim 1 wherein the compound capable of etching tungsten is at least one oxidizing agent.

8. The chemical mechanical polishing composition of claim 7 wherein the oxidizing agent is at least one peroxide compound.

9. The chemical mechanical polishing composition of claim 8 wherein the peroxide compound is hydrogen peroxide.

10. The chemical mechanical polishing composition of claim 9 including from about 0.1 to about 50 weight percent hydrogen peroxide.

11. The chemical mechanical polishing composition of claim 9 including from about 1.0 to about 10 weight percent hydrogen peroxide.

12. The chemical mechanical polishing composition of claim 1 wherein the compound capable of etching tungsten is at least one fluoride containing compound.

13. The chemical mechanical polishing composition of claim 9 further including at least one metal catalyst.

14. The chemical mechanical polishing composition of claim 13 wherein the metal catalyst is an iron catalyst selected from the group consisting of inorganic iron compounds and organic iron compounds having multiple oxidation states.

15. The chemical mechanical polishing composition of claim 14 wherein the iron catalyst is ferric nitrate.

16. The chemical mechanical polishing composition of claim 15 including from about 0.001 to about 2.0 weight percent ferric nitrate.

17. The chemical mechanical polishing composition of claim 1 wherein the compound capable of etching tungsten is hydrogen peroxide and wherein the composition further includes from about 0.001 to about 0.2 weight percent of an iron catalyst.

18. The chemical mechanical polishing composition of claim 1 including at least one metal oxide abrasive.

19. The chemical mechanical polishing slurry of claim 18 wherein the metal oxide abrasive is selected from the group including alumina, ceria, germania, silica, titania, zirconia, and mixtures thereof.

20. The chemical mechanical polishing composition of claim 1 including at least one metal oxide abrasive.

21. The chemical mechanical polishing slurry of claim 20 wherein the metal oxide abrasive consists of metal oxide aggregates having a size distribution less than about 1.0 micron and a mean aggregate diameter less than about 0.4 micron.

22. The chemical mechanical polishing slurry of claim 18 wherein the metal oxide abrasive consists of discrete, individual metal oxide spheres having a primary particle diameter less than 0.400 micron and a surface area ranging from about 10 $m^2/g$ to about 250 $m^2/g$.

23. The chemical mechanical polishing slurry of claim 18 wherein the metal oxide abrasive has a surface area ranging from about 5 $m^2/g$ to about 430 $m^2/g$.

24. The chemical mechanical polishing slurry of claim 23 wherein the metal oxide abrasive has a surface area of from about 30 $m^2/g$ to about 170 $m^2/g$.

25. The chemical mechanical polishing slurry of claim 18 wherein the metal oxide abrasive is a precipitated abrasive or a fumed abrasive.

26. The chemical mechanical polishing slurry of claim 18 wherein the metal oxide abrasive is silica.

27. The chemical mechanical polishing slurry of claim 26 wherein the silica is fumed silica.

28. The chemical mechanical composition of claim 1 including at least one stabilizer.

29. The chemical mechanical polishing composition of claim 28 wherein the stabilizer is malonic acid in an amount ranging from about 1 equivalents per catalyst to about 5 equivalents per catalyst.

30. A chemical mechanical polishing slurry comprising:
from about 1.0 to about 15.0 weight percent silica;
from about 0.001 to about 0.2 weight percent ferric nitrate catalyst;
from about 1.0 to about 10.0 weight percent hydrogen peroxide;
at least one stabilizer; and
from about 0.001 to about 1.0 wt % of at least one inhibitor of tungsten etching.

31. The chemical mechanical polishing slurry of claim 30 wherein the inhibitor of tungsten etching is pyridazine.

32. The chemical mechanical polishing slurry of claim 30 wherein the stabilizer is malonic acid in an amount ranging from about 1 to about 15 equivalents per catalyst.

33. A method for polishing a substrate including at least one tungsten layer comprising the steps of:
(a) admixing at least one compound that is capable of etching tungsten, at least one inhibitor of tungsten etching selected from compounds including at least one functional group selected from nitrogen containing heterocycles without nitrogen-hydrogen bonds, sulfides, oxazolidines and mixtures thereof, and deionized water to give a chemical mechanical polishing composition;

(b) applying the chemical mechanical polishing composition to the substrate; and
(c) removing at least a portion of the tungsten layer from the substrate by bringing a pad into contact with the substrate and moving the pad in relation to the substrate.

34. The method of claim 33 wherein the substrate further includes a titanium and/or titanium nitride metal layer wherein at least a portion of the titanium nitride layer is removed in step (c).

35. The method of claim 33 wherein the compound capable of etching tungsten is hydrogen peroxide.

36. The method of claim 35 wherein the chemical mechanical composition includes a catalyst selected from the group inorganic iron compounds and organic iron compounds.

37. The method of claim 36 wherein the catalyst is from about 0.001 to about 2.0 weight percent ferric nitrate.

38. The method of claim 33 wherein the chemical mechanical composition includes at least one metal oxide abrasive to give a chemical mechanical polishing slurry.

39. The method of claim 37 wherein the metal oxide abrasive is selected from the group including alumina, ceria, germania, silica, titania, zirconia, and mixtures thereof.

40. The method of claim 38 wherein the metal oxide abrasive is an aqueous dispersion of a metal oxide.

41. The method of claim 37 wherein the metal oxide abrasive is selected from the group consisting of precipitated alumina, fumed alumina, precipitated silica, fumed silica, and mixtures thereof.

42. The method of claim 37 wherein the abrasive is from about 1.0 to about 10.0 weight percent silica.

43. A method for polishing a substrate including tungsten layer comprising:
(a) admixing from about 1.0 to about 10.0 weight percent silica, from about 0.001 to about 0.2 weight percent ferric nitrate catalyst, from about 1.0 to about 10.0 weight percent hydrogen peroxide, from about 1 equivalent to about 15 equivalent per catalyst of malonic acid, from about 0.01 to about 0.5 weight percent of at least one inhibitor of tungsten etching selected from the group consisting of 4-ethyl-2 oxazoline 4-methanol, 2,3,5-trimethylpyrazine, 2-ethyl-3,5-dimethylpyrazine, quinoxaline, pyridazine, pyrazine, glutathione(reduced), thiophene, mercapto pyridine n-oxide, tetraethyl thiuram disulfide, and mixtures thereof, and deionized water to give a mechanical chemical polishing slurry;
(b) applying the chemical mechanical polishing slurry to the substrate; and
(c) removing at least a portion of the tungsten layer by bringing a pad into contact with the substrate and moving the pad in relation to the substrate.

44. The chemical mechanical polishing composition of claim 1 wherein the inhibitor of tungsten etching is a sulfide containing compound.

45. A chemical mechanical polishing composition comprising:
a compound that is capable of etching tungsten; and
pyridazine.

46. The chemical mechanical polishing composition of claim 1 wherein the nitrogen containing heterocycle without a nitrogen-hydrogen bond is selected from the group containing pyrazine, oxazolines, and mixtures thereof.

47. The chemical mechanical polishing composition of claim 1 wherein the inhibitor of tungsten etching is thiamine hydrochloride.

* * * * *